(12) United States Patent
Campardo et al.

(10) Patent No.: US 6,169,423 B1
(45) Date of Patent: Jan. 2, 2001

(54) METHOD AND CIRCUIT FOR REGULATING THE LENGTH OF AN ATD PULSE SIGNAL

(75) Inventors: Giovanni Campardo, Bergamo; Rino Micheloni, Turate; Matteo Zammattio, Milan; Donato Ferrario, Carugate, all of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/186,496

(22) Filed: Nov. 4, 1998

(30) Foreign Application Priority Data

Nov. 5, 1997 (EP) .................................................. 97830573

(51) Int. Cl.[7] .................................................. H03K 5/22
(52) U.S. Cl. .............................................. 327/26; 327/589
(58) Field of Search ........................... 327/141, 172–176, 327/178, 165, 166, 170, 390, 538, 589, 18–20, 26; 365/205–208

(56) References Cited

U.S. PATENT DOCUMENTS 5,912,572 * 6/1999 Graf, III ................................. 327/172
5,917,768 * 6/1999 Pascucci ................................. 365/210

* cited by examiner

Primary Examiner—My-Trang Nu Ton
(74) Attorney, Agent, or Firm—Theodore E. Galanthay, Esq.; David V. Carlson, Esq.; Seed IP Law Group, PLLC (57) ABSTRACT

The invention relates to a method and a circuit for regulating a pulse synchronization signal (ATD) for the memory cell read phase in semiconductor integrated electronic memory devices. The pulse signal (ATD) is generated upon detection of a change in logic state of at least one of a plurality of address input terminals of the memory cells, so as to also generate an equalization signal (SAEQ) to a sense amplifier. The SAEQ pulse is blocked (STOP) upon the row voltage reaching a predetermined sufficient value to provide reliable reading. Advantageously, the pulse blocking is produced by a logic signal (STOP) activated upon a predetermined voltage value being exceeded during the overboost phase of the addressed memory row.

20 Claims, 5 Drawing Sheets

METHOD AND CIRCUIT FOR REGULATING THE LENGTH OF AN ATD PULSE SIGNAL

TECHNICAL FIELD

This invention relates to a method and a circuit for regulating the duration of an ATD pulse synchronization signal for the read phase of non-volatile memory cells in electronic memory devices integrated in a semiconductor.

In particular, the invention relates to a circuit for regulating an ATD pulse synchronization signal in order to regulate the read phase of non-volatile memory cells in electronic memory devices integrated in a semiconductor, the circuit being of a type which is controlled by a change of logic state on at least one of a plurality of address input terminals of said memory cells, and comprises a NOR type of structure between said address terminals and an output node whence an equalization signal to a sense amplifier is derived.

BACKGROUND OF THE INVENTION

As is well known, the read mode, for reading the contents of the cells of a semiconductor integrated electronic memory circuit, is entered by completing a predetermined sequence of operations known as the reading cycle.

A reading cycle begins with the memory address of data to be read being presented to the input terminals of a memory circuit. An input stage senses the switching of an address presented to these terminals, thereby to initiate a reading operation.

Row and column decoding circuits will select the memory word that has been addressed.

The circuit portion arranged to read the contents of the memory cells and convert the analog data read to digital data is referred to as the sense or read amplifier. This amplifier usually is of the differential type and has a pair of inputs which are connected to a cell of the memory matrix and a reference cell, respectively. Reading is enabled by an unbalance in the loads of the matrix leg and the reference leg.

The data sensed by the sense amplifier is then output through a buffer output stage.

Each of the above phases of the reading cycle must have a preset duration consistent with the memory access times specified by the memory circuit specifications.

All of the various phases of the reading cycle are clocked by synchronization pulses derived from a single main or ATD (Address Transition Detection) pulse. The ATD pulse is generated within the memory circuit whenever a change in address is detected on the input terminals.

In general, the ATD pulse is generated by a NOR structure whose output is at a normally high logic level.

Upon the occurrence of a change in logic level at even one only of the input terminals, the NOR structure switches its output to allow a terminal from which the ATD pulse is delivered to be discharged toward ground.

Figure 1:
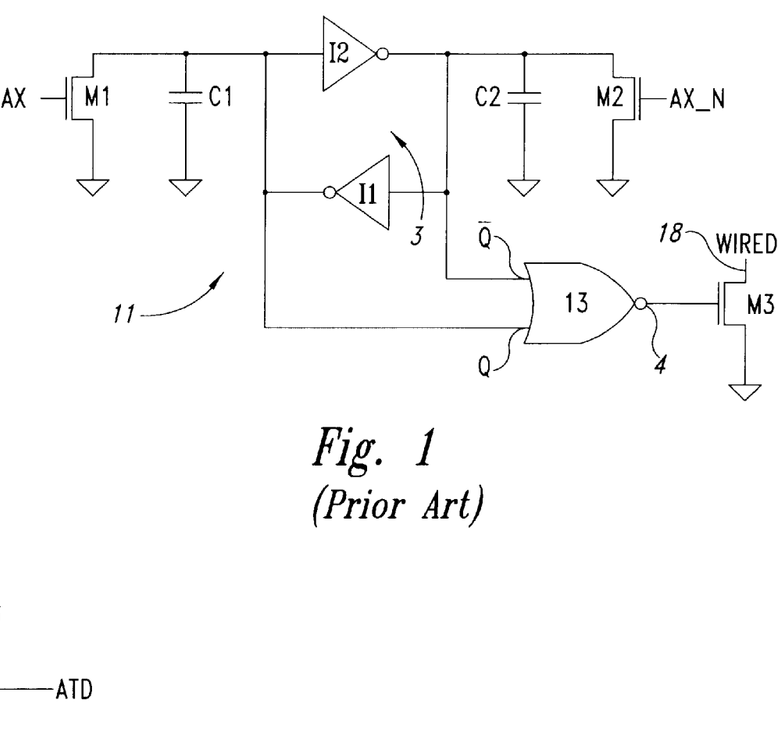
FIG. 1 shows schematically a circuit for generating a pulse ATD signal. according to the prior art.

Shown schematically in the accompanying FIG. 1 is circuitry for generating the ATD signal according to the prior art.

FIG. 1 shows an ATD cell or circuitry 11 comprising two N-channel MOS input transistors, indicated at M1 and M2, which are highly conductive on account of their high W/L ratio.

The cell 1 further comprises a pair of inverters I1, I2, each including a CMOS complementary pair having a pull-up transistor and a pull-down transistor. The pull-up transistors of the inverters I1, I2 are highly resistive, and therefore little conductive, they having a reduced W/L ratio.

The structure resulting from the coupling of the inverters I1 and I2 is that of a latch register 3 having outputs Q and $\overline{Q}$, wherein the former, Q, is at a normally high logic level.

The latch 3 is input a signal AX and the corresponding negated signal AX_N from one of said input terminals, as smoothed by capacitors C1 and C2. These signals are enabled to pass on to the latch 3 by the respective NMOS transistors M1 and M2.

During the wait phase, only one of the input signals will be at a high logic value, e.g., AX_N. The capacitor C2 will be discharged by the pull-up of the first inverter I1.

Upon the occurrence of an input transition, the capacitor C1 of the transistor M1 is quickly discharged, while the capacitor C2 begins to be charged by the pull-up of the second inverter I2. In consequence of this, the first output Q of the latch 3 is at once brought to a low logic level. The other output Q# will instead take a little longer to change its state because the pull-up transistors of the inverters I1, I2 are highly resistive. Thus, there will be a time period when both said outputs are at a low logic level.

With the outputs Q and $\overline{Q}$ connected directly to the respective inputs of a logic gate I3 of the NOR type, the output of the gate I3 will be driven to a high logic level, thereby allowing an NMOS transistor M3 connected to the output node 4 of the circuit 11 to be turned on.

Figure 2:
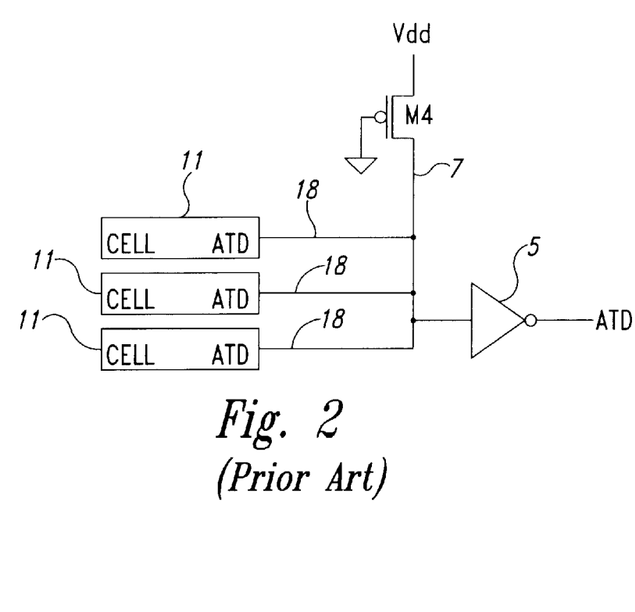
FIG. 2 shows schematically a set of circuits as in FIG. 1, connected into a distributed NOR structure for generating the ATD signal.

Associated with each address input terminal of the memory circuit is a cell 11, and a plurality of cells have their outputs tied to a common line as shown schematically in FIG. 2.

In this approach, referred to in the art as the distributed NOR, the output 18, for each cell, isconnected to a single ATD-LINE line 7 which is usually in the form of a metallization line taken to the supply Vdd through a PMOS transistor M4 having its control terminal connected to a ground GND.

An ATD pulse is delivered from this line 7 through an inverter 5.

Each ATD cell 11 can bias the line 7 to ground on the occurrence of an input transition. This line 7 being relatively long, it exhibits resistance and intrinsic capacitance of relatively high values, and if the switching involves all the addresses in parallel, the line 7 will be discharged at a very fast rate; otherwise, when the switching only affects the farthest terminal from the output node, the line 7 would be discharged at a slower rate.

The ATD signal performs two basic functions: a first is that of initiating the supply voltage boost operations, and the second is that of initiating the equalization of the sense amplifier nodes.

Figure 3:
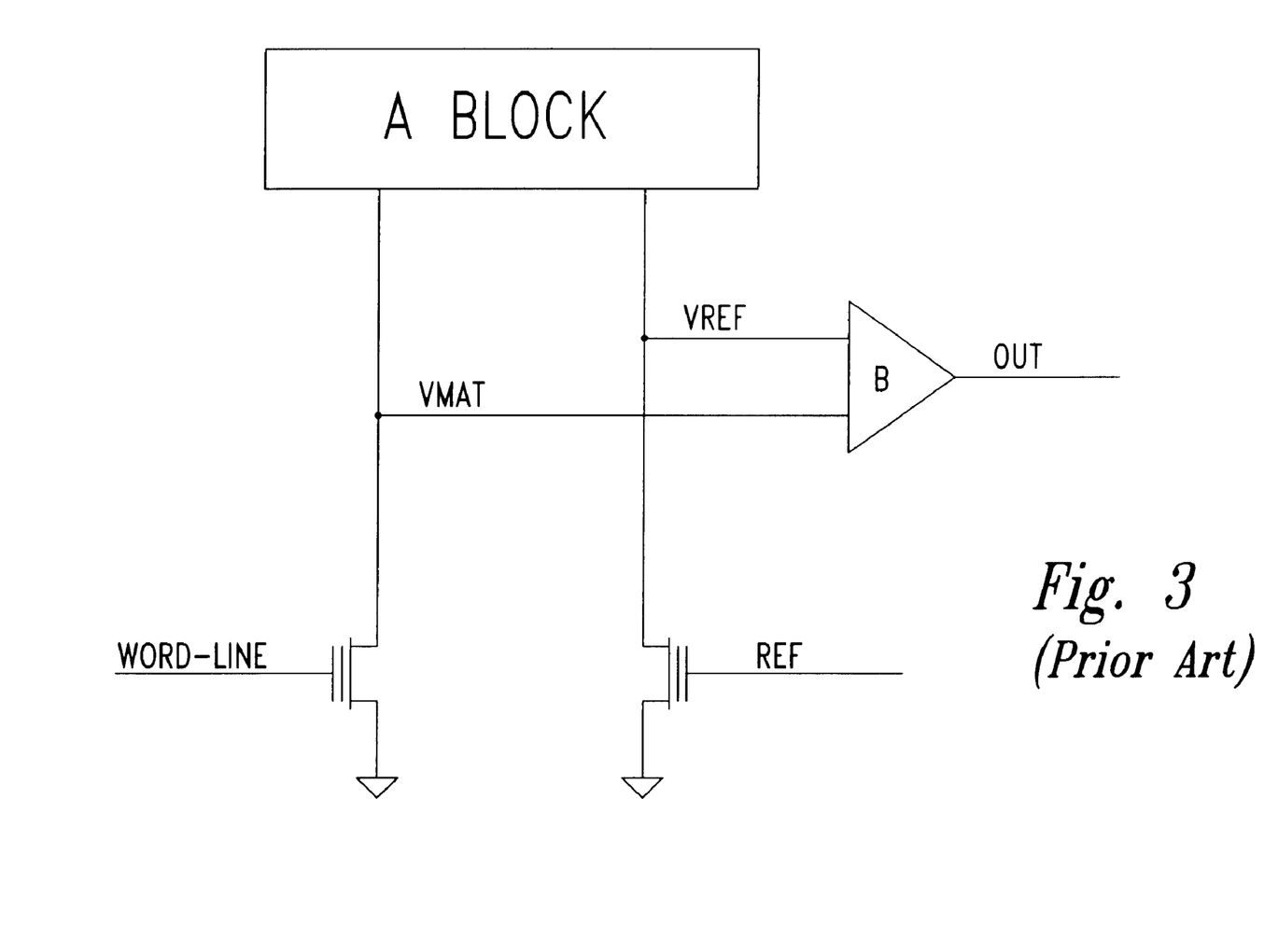
FIG. 3 shows schematically a read amplifier incorporated to an electronic memory device and utilizing the ATD signal to initiate the read phase.

Shown schematically in the accompanying FIG. 3 are the main features of a conventional sense amplifier.

A circuit block A represents that portion of the circuit which is intended for the current/voltage conversion, and a circuit block B represents the circuit portion which drives the output stages. The block A is to convert the value of the current, taken up by the non-volatile memory cells being written or erased, to a voltage.

The sense amplifier can discriminate between the logic contents, a "0" or a "1", of a selected memory cell by verifying the unbalance of the matrix and reference nodes Vref and Vmat, respectively.

The conventional technique is to equalizing the nodes Vref and Vmat before effecting a reading.

The ATD signal is to generate an equalization signal, designated SAEQ hereinafter, to prepare the sense amplifier for a reading operation to be completed within the shortest possible time.

Figure 4:
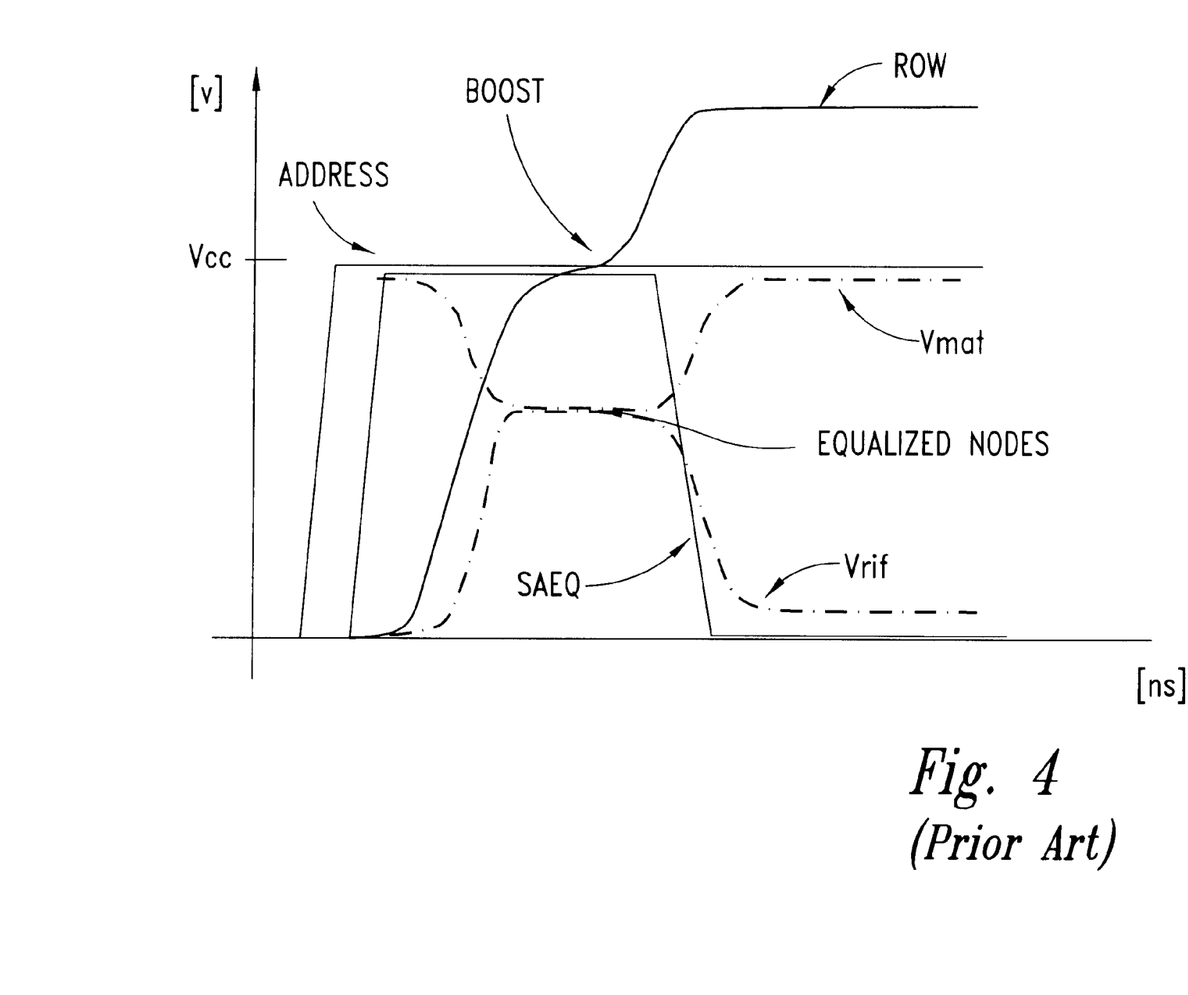
FIG. 4 shows a set of curves of voltage signals plotted against time, as present in the amplifier of FIG. 3.

FIG. 4 is a plot vs. time of a plurality of voltage signals present in the memory circuit immediately after a transition on an address input.

A rise in the signal SAEQ reflects in a similar rise of the boost signal for the memory row or word line, and in a short phase of equalization of the nodes Vref and Vmat. The read phase proper takes place on the falling edge of the signal SAEQ, when the control of the nodes Vref and Vmat is shifted from the equalization network to the reference and the matrix cell.

From all of the above considerations, it can be appreciated that the duration of the pulse SAEQ is vital to the memory access time.

To avoid harmful oscillations of the nodes Vref and Vmat, the equalization network should only be released once the selected cell is biased at the highest gate voltage and, accordingly, able to take up maximum current. Otherwise, an erased cell could be mistaken for a written one.

In this respect, it should be considered that memories operated at low supply voltages require that the cell be biased with a boosted voltage.

Furthermore, in the prior art solutions, the ATD pulse is extended through a chain of inverters to provide the signal SAEQ; the consequent timing is highly responsive to temperature and supply voltage variations, and for modern memory devices, variations of as much a 150° C. and a few volts are to be anticipated.

More complicated solutions provide a pulse of preset duration to a fixed time for conditions of minimum voltage and maximum temperature, so as to have a sufficient margin in every condition of operation. Thus, in the opposite operating conditions, i.e., minimum temperature and maximum supply voltage, the pulse duration will be much longer, resulting in a waste of memory access time.

SUMMARY OF THE INVENTION

An embodiment of this invention provides a method and a circuit for regulating the duration of the ATD signal pulse, which method and circuit have such respective functional and structural features as to overcome the drawbacks which are besetting the solutions according to the prior art.

The embodiment stops or blocks the ATD, or SAEQ, pulse upon the row voltage reaching a sufficient value or height to provide reliable reading.

In this way, the ATD signal is substantially adaptive and unaffected by parameters outside the actual execution of the read phase.

The features and advantages of the method and the circuit of this invention will be apparent from the following description of embodiments thereof, given by way of non-limitative examples with reference to the accompanying drawings.

DETAILED DESCRIPTION OF THE INVENTION

Figure 5:
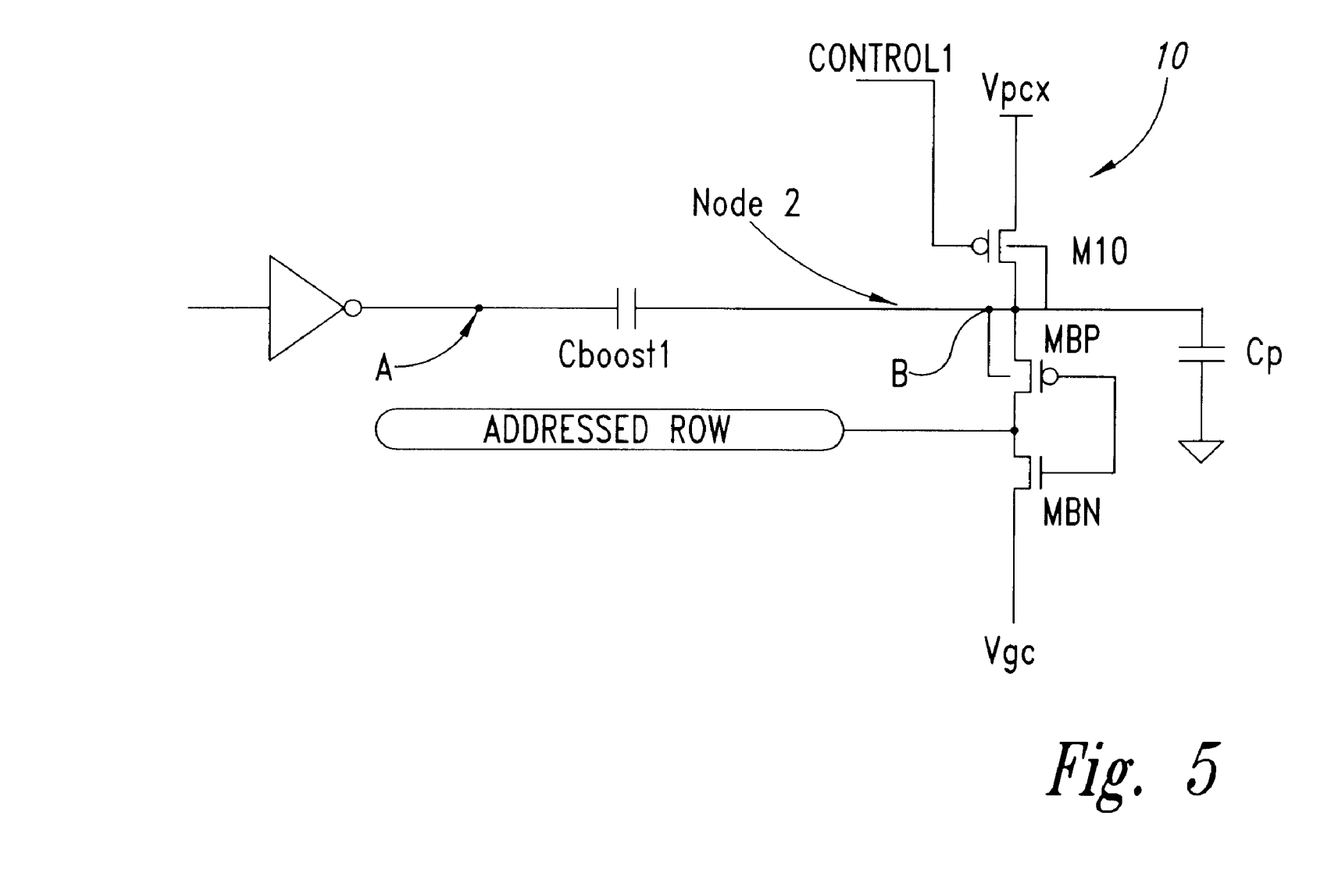
FIG. 5 shows schematically a row decoding circuit portion incorporated to an electronic memory device.
Figures 6, 6A, 7:
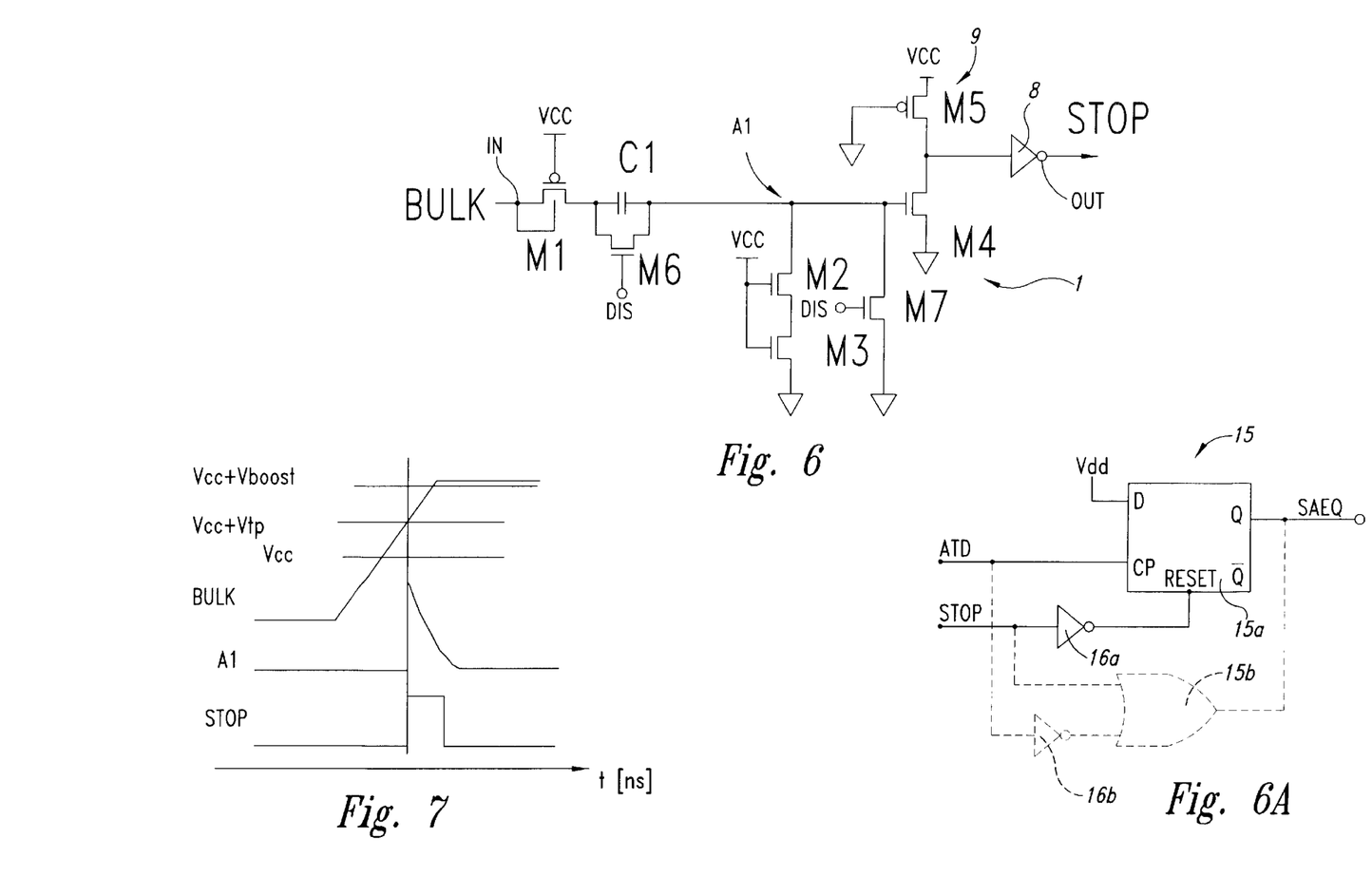
FIG. 6 shows schematically a circuit embodying this invention.
FIG. 7 shows voltage (V) vs. time (ns) plots representing signals present in the regulator circuit of FIG. 6.

Referring to the drawing views, in particular to the example of FIGS. 5 and 6, generally and schematically shown at 1 is a circuit of this invention for regulating the duration of an ATD (Address Transition Detection) signal to be used during a memory cell reading cycle.

Memory cells are here a plurality of memory elements incorporated to a conventional semiconductor integrated electronic device which is constructed as a matrix of cells organized into rows and columns. Associated with the matrix are corresponding row and column decoding circuit portions and sense amplifiers.

These circuit components are powered between a first supply voltage reference Vcc and a second voltage reference GND.

The memory cells may be of a type whichever, those of the non-volatile type being preferred.

Shown in FIG. 5 is a final portion 10 of the row decoder, together with a portion of the voltage booster circuitry for use with the present invention.

A first circuit node A is shown in the portion 10 as having one end of a capacitor Cboost1 connected thereto which is adapted to be charged and discharged during the row voltage boost phase.

The other end of the capacitor Cboost1 is connected to a second circuit node B corresponding to the supply reference of the row drivers of the memory matrix.

The second node B is connected toward a voltage reference Vpcx through a PMOS transistor M10 having its body terminal connected to the node B and having the control terminal arranged to receive a signal CONTROL.

A parasitic capacitor Cp is present between the node B and the second ground reference.

A complementary pair of transistors, PMOS transistor MBP and NMOS transistor MBN, further connect the node B to the addressed memory row. The source terminal of the NMOS transistor MBN in this complementary pair is connected to a potential Vgc representing a signal ground.

The capacitor Cboost1 should be precharged to the supply voltage Vcc prior to receiving the boosted voltage pulse. For this to occur, the node A should be at ground potential and the node B biased at Vcc.

The control signal CONTROL turns off the PMOS transistor M10 such that the node B can be voltage boosted and the boosted voltage transmitted to the addressed row through the transistor MBP, the other transistor MBN being turned off.

Depicted in FIG. 6 is the basic construction of the circuit 1 of this invention, which is connected to the input of the node B of FIG. 5 to pick up a boosted voltage signal, indicated at BULK in FIG. 6.

The circuit 1 has an input terminal IN and an output terminal OUT. The input IN is, as previously stated, connected to the node B and has a PMOS pass transistor M1 cascade connected thereto which has its control terminal connected to the first supply reference Vcc.

A capacitor C1 is connected in series with this pass transistor M1 and is to charge an internal node A1 at a predetermined time constant.

Between the node A1 and the second supply reference GND, a pair of NMOS transistors M2, M3 are connected in series with each other and have their gate terminals connected to the supply Vcc.

The combined series resistances of the channels of M2 and M3, in cooperation with the capacitor C1, set the time constant RC for charging and discharging the node A1.

Advantageously, the transistor pair M2 and M3 provide a cascode effect for the connection to the ground GND.

An additional NMOS transistor M7 is connected between the node A1 and ground, and receives on its gate terminal a signal DIS enabling a fast discharge of the node A1, so as to restore the circuit 1 for operation at the next input transition.

A short-circuit transistor M6 is connected in parallel across the capacitor C1 and receives a signal DIS on its gate terminal for re-distributing the charge onto the capacitor C1, causing the discharge phase to occur at a near-zero voltage difference, and accordingly, producing a smaller width pulse toward ground.

If C1 stays charged, the node A1 may acquire a negative potential, but the transistors M6 and M7 provided are effective to avoid this possible problem.

The potential at the node A1 is applied directly to the gate terminal of an NMOS pull-down transistor M4 included in a buffer stage 9 which also comprises a PMOS transistor M5.

The stage 9 is connected between the supply Vcc and the ground GND, with the pull-up transistor M5 having its gate terminal connected to ground.

The interconnection node between the transistors M4 and M5 of the stage 9 is connected to the output OUT of the circuit 1 through an inverter 8 allowing a signal STOP to be output which is active to turn off the signal SAEQ.

As shown in FIG. 6A, the signals STOP and ATD are coupled to first and second inputs of a logic stage 15 which produces the signal SAEQ at its output. The logic stage 15 can be using various logical elements such as aDT flip-flop gate 15A having a reset input that is coupled to the STOP signal via an inverter 16A, a timing input coupled to the ATD signal, and an output that provides the signal SAEQ. Such a configuration of the flip-flop 15A generally implements a logical AND. Alternatively, the logic stage 15 can be implemented using a NOR gate 15B having a first input coupled to the STOP signal and a second input coupled to the ATD signal via an inverter 16B. In whichever configuration, the logic stage 15 inactivates the SAEQ signal (goes low) in response to the STOP signal being activated (goes high).

It will be appreciated from the foregoing that the inventive circuit acts as a shunter capable of detecting the overboost occurring to the addressed memory row and of producing a stop or interrupt signal which blocks the signal SAEQ and restores it to ground. In this way, the signal SAEQ only remains active for the time required to complete the reading cycle.

In other words, it is as if the signal SAEQ were provided with a self-turn-off function that cancels it once the effective memory access sought is obtained.

The signal BULK picked up from the node B is normally at the potential Vcc, so that the transistor M1 is off and the node A1 held to ground by the transistors M2 and M3. In these conditions, the signal STOP will be at a logic low as clearly shown in FIG. 7.

Upon the signal BULK exceeding by a threshold the supply Vcc, the transistor M1 begins to conduct and, in view of a suitable ratio having been selected between M1 and the series of the transistors M2, M3, the transistor M4 can be turned on by the potential at the node A1, thereby bringing the signal STOP to a logic high.

In essence, the signal STOP is activated upon the signal BULK exceeding by a PMOS threshold the value of the supply Vcc.

Once the input step is depleted, the node A1 is discharged at a preset time constant to restore the initial conditions.

The waveform of the node A1 is shown in FIG. 7. It should be noted that on the falling edge of the signal BULK there may occur a pulse toward ground which is undesired and likely to trigger latchup phenomena. This possible problem has already been corrected by providing the pair of transistors M2, M3 in cascade configuration.

The method and circuit of this invention do solve the technical problem and afford a number of advantages, outstanding among which is the adjustability of the AID pulse duration to meet actual memory access requirements.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for regulating the duration of a pulse synchronization signal for a memory cell read phase in semiconductor integrated electronic memory devices, the method comprising generating said pulse synchronization signal upon detection of a change in logic state of at least one of a plurality of address input terminals of said memory cells, so as to also generate an equalization signal to a sense amplifier, boosting a row voltage of an addressed memory row above a supply voltage, and blocking the equalization signal upon the row voltage of the addressed memory row reaching a value above the supply voltage sufficient to provide reliable reading.

2. A method according to claim 1, wherein said blocking is produced by a logic signal activated upon a predetermined voltage value being exceeded during an overboost phase of the addressed memory row.

3. A method according to claim 2, wherein said predetermined voltage value is equal to a supply voltage plus a threshold of a transistor.

4. A method according to claim 3, wherein said threshold of said transistor is that of a PMOS transistor.

5. A circuit for regulating a pulse synchronization signal in order to regulate a read phase of memory cells in semiconductor integrated electronic memory devices, the circuit being controlled by a change of logic state on at least one of a plurality of address input terminals of said memory cells, the circuit comprising a NOR structure between said address input terminals and an output node from which an equalization signal to a sense amplifier is derived, a shunter having an input terminal connected to a circuit node of the memory device whereto an addressed memory row overboost signal is presented by an overboost circuit, and an output terminal delivering an interrupt logic signal to stop said equalization signal.

6. A regulating circuit according to claim 5, wherein said shunter comprises a cascade of a pass transistor and a capacitor for charging and/or discharging an internal node at a preset time constant, at least one pair of transistors being provided between said internal node and a supply reference.

7. A regulating circuit according to claim 6, wherein said at least one pair of transistors has channels with combined series resistances, which in cooperation with said capacitor (C1), sets a time constant RC for charging and discharging the internal node.

8. A regulating circuit according to claim 5, further comprising a short circuit transistor connected in parallel across said capacitor for re-distributing the charge thereon.

9. A regulating circuit according to claim 6, the internal node has a potential that is applied directly to a gate terminal of an NMOS pull-down transistor included in a buffer stage which also comprises a PMOS pull-up transistor.

10. A regulating circuit according to claim 9, wherein the transistors of the buffer stage are connected to each other at an interconnection node that is connected to the output of the regulating circuit through an inverter.

11. A regulating circuit for regulating an ATD signal to regulate a read phase of memory cells in semiconductor memory devices, the regulating circuit comprising:
  a shunter stage having an input node for receiving an overboost signal and an output node the shunter stage being structured to activated at the output node a stop signal in response to the overboost signal attaining a value greater that a supply voltage by a predetermined threshold amount; and
  a logic stage having a first input node coupled to the output node of the shunter stage and an output node, the logic stage being structured to inactivate an equalization signal at the output node of the logic stage in response to the stop signal being activated by the shunter stage.

12. The regulating circuit of claim 11 wherein the logic stage includes an inverter having an input node coupled to the first input node and an output node and a flip-flop gate having a first input node coupled to the output node of the inverter, a second input node coupled to the ATD signal, and an output node acting as the output node of the logic stage.

13. The regulating circuit of claim 11 wherein the logic stage has a second input node coupled to the ATD signal; an inverter having an input node coupled to the second input node and an output node; and a NOR gate having a first input node coupled to the first input node of the logic stage, a second input node coupled to the output node of the inverter, and an output node coupled to the output node of the logic stage.

14. The regulating circuit of claim 11 wherein the shunter circuit includes an RC circuit stage coupled to the input node of the shunter circuit and an output stage coupled between the RC circuit stage and the output node of the shunter circuit.

15. The regulating circuit of claim 14 wherein the RC circuit stage includes a capacitor element coupled between the input of the shunter circuit and the output stage and a set of one or more transistors coupled to a voltage reference and to the capacitor element at an internal node, the set having a resistance that in cooperation with the capacitor element sets a time constant for charging and discharging the internal node.

16. The regulating circuit of claim 15 wherein the shunter circuit includes a discharge transistor coupled to the internal node and having a control terminal that, when activated causes the discharge transistor to discharge the internal node.

17. The regulating circuit of claim 15 wherein the RC circuit stage includes a short-circuit transistor connected in parallel across the capacitor element for re-distributing charge thereon.

18. The regulating circuit of claim 11 wherein the shunter circuit includes a pass transistor and an output stage, the pass transistor having a first terminal coupled to the input node of shunter circuit, a second terminal coupled to the output stage, and a control terminal coupled to a voltage reference, the pass transistor causing the output stage to transmit the stop signal in response to the overboost signal exceeding the voltage reference by a threshold amount.

19. The regulating circuit of claim 18 wherein the output stage includes a pull-up transistor having a first terminal coupled to the voltage reference and a second terminal; a pull-down transistor having a first terminal coupled to the second terminal of the pull-up transistor, a second terminal coupled to ground, and a control terminal coupled to the second terminal of the pass transistor; and an inverter coupled between the first terminal of the pull-down transistor and the output node of the shunter stage.

20. The regulating circuit of claim 18 wherein the shunter circuit includes a capacitor coupled between the pass transistor and the output stage and a pair of transistors coupled between the output stage and ground, the capacitor and pair of transistors acting as an RC circuit to set a time constant for charging and discharging a control terminal of the output stage.

* * * * *

UNITED STATES PATENT AND TRADEMARK OFFICE
CERTIFICATE OF CORRECTION

PATENT NO. : 6,169,423 B1
DATED : January 2, 2001
INVENTOR(S) : Giovanni Campardo et al.

It is certified that error appears in the above-identified patent and that said Letters Patent is hereby corrected as shown below:

<u>Title page,</u>
Item [56], the following U.S. PATENT DOCUMENTS, should appear as follows:
-- 4,807,193   02/21/89   Takemae et al. ................... 365/205 --
-- 5,029,135   07/02/91   Okubo ............................. 365/203 --
-- 5,343,432   08/30/94   Matsuo et al. ..................... 365/203 --
-- 5,361,237   11/01/94   Chishiki .......................... 365/230.06 --

Signed and Sealed this

Second Day of July, 2002

*Attest:*

*Attesting Officer*

JAMES E. ROGAN
*Director of the United States Patent and Trademark Office*